United States Patent
Kim et al.

(10) Patent No.: US 12,382,760 B2
(45) Date of Patent: Aug. 5, 2025

(54) LIGHT EMITTING DIODE PACKAGE

(71) Applicant: SEOUL SEMICONDUCTOR CO., LTD., Gyeonggi-do (KR)

(72) Inventors: Byoung Sung Kim, Gyeonggi-do (KR); In Kyu Park, Gyeonggi-do (KR); Jun Myeong Song, Gyeonggi-do (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 885 days.

(21) Appl. No.: 17/193,447

(22) Filed: Mar. 5, 2021

(65) Prior Publication Data
US 2021/0193895 A1 Jun. 24, 2021

Related U.S. Application Data

(63) Continuation of application No. PCT/KR2019/008833, filed on Jul. 17, 2019.

(51) Int. Cl.
*H10H 20/857* (2025.01)
*H01L 25/16* (2023.01)
(Continued)

(52) U.S. Cl.
CPC ......... *H10H 20/857* (2025.01); *H01L 25/167* (2013.01); *H10H 20/8506* (2025.01); *H10H 20/8512* (2025.01); *H10H 20/856* (2025.01)

(58) Field of Classification Search
CPC ..... H01L 33/62; H01L 25/167; H01L 33/486; H01L 33/502; H01L 33/60; H01L 33/20;
(Continued)

(56) References Cited

U.S. PATENT DOCUMENTS 7,737,461 B2 * 6/2010 Maeda .................. H01L 33/486
257/E33.072
2011/0241030 A1 10/2011 Kim
(Continued)

FOREIGN PATENT DOCUMENTS

CN 102254910 A 11/2011
CN 202067829 U 12/2011
(Continued)

OTHER PUBLICATIONS

English Translation for KR10-2012-0079668, date Jul. 13, 2012 (10 pages) (Year: 2012).*

(Continued)

*Primary Examiner* — Phat X Cao
(74) *Attorney, Agent, or Firm* — Perkins Coie LLP

(57) ABSTRACT

A light emitting diode package includes a housing including a body part, a first lead, a second lead, a light emitting diode chip, and a Zener diode. The body part has a cavity that is open at the top and has inclined side surfaces. The first lead and the second lead are supported by the housing and are disposed apart from each other so as to be electrically insulated. The light emitting diode chip is electrically connected to the first lead and the second lead and mounted within the cavity of the body part. The Zener diode is mounted on one side of the light emitting diode chip and inside the cavity of the body part.

18 Claims, 16 Drawing Sheets

(51) Int. Cl.
*H10H 20/85* (2025.01)
*H10H 20/851* (2025.01)
*H10H 20/856* (2025.01)

(58) Field of Classification Search
CPC .............. H10H 20/857; H10H 20/8506; H10H 20/856; H10H 20/819; H10H 20/841
See application file for complete search history.

(56) References Cited

U.S. PATENT DOCUMENTS

| | | | |
|---|---|---|---|
| 2012/0275186 A1 | 11/2012 | Min | |
| 2013/0264946 A1 | 10/2013 | Xu et al. | |
| 2014/0071700 A1* | 3/2014 | Yoon | H01L 33/486 |
| | | | 362/382 |
| 2017/0110637 A1* | 4/2017 | Lim | H01L 25/167 |
| 2018/0175265 A1* | 6/2018 | Kim | H01L 27/15 |
| 2018/0212117 A1* | 7/2018 | Yu | H01L 33/62 |

FOREIGN PATENT DOCUMENTS

| | | |
|---|---|---|
| CN | 204130589 U | 1/2015 |
| CN | 105830240 A | 8/2016 |
| CN | 206040686 U | 3/2017 |
| CN | 107039570 A | 8/2017 |
| CN | 108206235 A | 6/2018 |
| DE | 202016008784 U1 | 10/2019 |
| JP | 2005-136378 A | 5/2005 |
| JP | 2005136378 | 5/2005 |
| KR | 100843425 B1 | 7/2008 |
| KR | 1020120079668 | 7/2012 |
| KR | 1020130021314 | 3/2013 |
| KR | 20170044005 A | 4/2017 |
| KR | 1020180000976 A * | 1/2018 |
| KR | 1020180020685 | 2/2018 |
| KR | 20180070149 A | 6/2018 |
| KR | 1020180070149 | 6/2018 |
| KR | 1020180071911 | 6/2018 |

OTHER PUBLICATIONS

English Translation for KR 10-2018-0000976, date Jan. 4, 2018 (15 pages) (Year: 2018).*
Extended / Supplementary European Search Report issued in corresponding EP Application No. 19858225.6, issued May 18, 2022, 9 pages.
International Search Report for International Application PCT/KR2019/008833, mailed Oct. 29, 2019.
Office Action from corresponding Chinese Patent Application No. 201910808022.3 dated Mar. 31, 2023 (8 pages).
Office Action from corresponding Chinese Patent Application No. 201911011553.6 dated Mar. 31, 2023 (9 pages).
Office Action in Chinese Application No. 201910808022.3 dated Dec. 7, 2023.
Office Action from corresponding Korean Patent Application No. 10-2019-0084061, dated Jul. 11, 2019 (10 pages).
Office Action from corresponding EP Patent Application No. EP19858225.6, dated Dec. 13, 2024.

* cited by examiner

LIGHT EMITTING DIODE PACKAGE

CROSS-REFERENCE OF RELATED APPLICATIONS AND PRIORITY

The Present Application is a continuation application of International Application No. PCT/KR/2019/008833 filed Jul. 17, 2019 which claims priority to Korean Applications Nos. 10-2018-0107080 filed Sep. 7, 2018 and 10-2019-0084061 filed Jul. 11, 2019, the disclosures of which are incorporated by reference in their entirety.

TECHNICAL FIELD

Embodiments of the present disclosure relate to a light emitting diode package and, more particularly, to a light emitting diode package capable of improving luminous efficacy of light emitted therefrom.

BACKGROUND

A light emitting diode is an inorganic semiconductor device that emits light through recombination of electrons and holes. In recent years, light emitting diodes are used in various fields including a display apparatus, a vehicular lamp, general lighting, and the like. The light emitting diodes have various advantages, such as longer lifespan, lower power consumption and rapider response time than existing light sources. With such advantages, the light emitting diodes have replaced existing light sources.

In manufacture of a package using such a light emitting diode, a Zener diode can be mounted inside the package. Conventionally, the Zener diode is exposed from the light emitting diode package or disposed inside a housing thereof.

In the structure where the Zener diode is exposed from the light emitting diode package, some fraction of light emitted from the light emitting diode is absorbed by the Zener diode, thereby causing light loss.

In the structure having the Zener diode disposed inside the housing of the light emitting diode package, the size of the housing may increase. The housing is formed by injection molding, and it is desirable to avoid damage to electrical connection of the Zener diode in the housing.

SUMMARY

Embodiments of the present disclosure provide a light emitting diode package capable of minimizing light loss by a Zener diode disposed therein.

Embodiments of the present disclosure provide a light emitting diode that allows convenient installation of a Zener diode therein while improving stability in electrical connection of the Zener diode.

Embodiments of the present disclosure provide a light emitting diode that can minimize deterioration in light loss and reliability due to discoloration of a lead frame by sulfur dioxide or hydrogen sulfide by minimizing an exposed region of the lead frame, in which a light emitting diode and a Zener diode are disposed.

In accordance with embodiments of the present disclosure, a light emitting diode package includes a body having a cavity open at an upper side thereof and including beveled surfaces constituting side surfaces of the cavity, a first lead and a second lead supported by the body and separated from each other to be electrically insulated from each other, a light emitting diode chip electrically connected to the first lead and the second lead and mounted in the cavity of the body, and a Zener diode mounted in the cavity of the body. At least one of the beveled surfaces of the body surrounding the light emitting diode chip has a different shape from other beveled surfaces thereof. The Zener diode is mounted at one side of the light emitting diode chip, and one of the beveled surfaces surrounding the light emitting diode chip is placed near the Zener diode.

In at least one variant, another beveled surface of the beveled surfaces surrounding the light emitting diode chip may have an inclination gradually increasing in an upward direction thereof. One of the beveled surfaces surrounding the light emitting diode chip may have the same inclination in an upward direction thereof.

In another variant, the light emitting diode package may further include a cover portion covering one of the beveled surfaces of the body surrounding the light emitting diode chip. The cover portion may be disposed to cover the Zener diode. The cover portion may include a beveled surface having an inclination gradually increasing in an upward direction thereof. The cover portion may be formed of a substance containing a reflective material.

In yet another variant, the light emitting diode package may further include a coating layer covering the cover portion and the other beveled surfaces of the body surrounding the light emitting diode chip. The coating layer may be formed of a substance containing a reflective material. The reflective material may include at least one selected from among $TiO_2$ and $Al_2O_3$.

In another variant, the body may include a stepped portion dividing a mounting region of the light emitting diode chip from a mounting region of the Zener diode, and the stepped portion may protrude upwards above the mounting region of the light emitting diode chip.

In at least one variant, the light emitting diode package may further include a cover portion covering one of the beveled surfaces of the body surrounding the light emitting diode chip, wherein the cover portion is formed to a height of the stepped portion.

In another variant, the Zener diode may be mounted on the first lead to be electrically connected to the first lead and may be electrically connected to the second lead through a wire. The first lead and the second lead exposed to a mounting region of the light emitting diode chip may partially protrude in an upward direction. Two of the beveled surfaces of the body surrounding the light emitting diode chip may be disposed at opposite sides.

In further another variant, at least one of the beveled surfaces of the body surrounding the light emitting diode chip may have a lower portion extending to the light emitting diode chip to be disposed at one end thereof under the light emitting diode chip.

In another variant, a portion of the body constituting a bottom of the cavity may form an upwardly protruding dam. At least a portion of the dam may be disposed under the light emitting diode chip.

In further another variant, the first lead may include a first mount on which the light emitting diode chip is mounted. The second lead may include a second mount on which the light emitting diode chip is mounted. At least one side surface of each of the first mount and the second mount may have a stepped structure.

In at least one variant, the light emitting diode package may further include a wavelength conversion member filling the cavity of the body to cover the light emitting diode chip. The light emitting diode package may further include a first wavelength conversion member and a second wavelength conversion member. The first wavelength conversion member may cover at least an upper surface of the light emitting diode chip. The second wavelength conversion member may fill the cavity of the body to cover the light emitting diode chip and the first wavelength conversion member. The first wavelength conversion member and the second wavelength conversion member may convert light into light in different wavelength bands.

In some forms, a region of a light emitting diode package in which a Zener diode is disposed is covered by a substance containing a reflective material to form a beveled cover portion, thereby minimizing loss of light emitted from a light emitting diode chip by the Zener diode, and a wire electrically connecting the Zener diode to a first lead or a second lead is covered by the cover portion, thereby improving stability of electrical connection of the Zener diode while reducing external impact.

Further, with the Zener diode disposed inside the light emitting diode package, beveled surfaces of a cavity of a housing in which a light emitting diode chip is disposed have similar shapes as much as possible, thereby enabling uniform emission of light from the light emitting diode package.

An exposed region of a lead frame in which the light emitting diode and the Zener diode are mounted is minimized, thereby preventing deterioration in reliability by protecting products from sulfur dioxide or hydrogen sulfide causing discoloration of the lead frame in outdoor use of the light emitting diode package.

Further, the light emitting diode package according to these embodiments employs a flip-chip type light emitting diode chip and does not require a separate component for electrical connection of the light emitting diode chip to the lead frame, thereby minimizing the size of the light emitting diode package.

Further, in the body of the light emitting diode package, a beveled surface on which the Zener diode is disposed is formed in a different structure from other surfaces of the body to secure a space for installation of the Zener diode, thereby minimizing the size of the light emitting diode package.

Further, a portion of the lead frame may be exposed to a lower surface of the body, thereby facilitating discharge of heat from the light emitting diode chip to the outside through the lead frame.

DETAILED DESCRIPTION OF EMBODIMENTS

Hereinafter, embodiments of the present disclosure will be described in detail with reference to the accompanying drawings.

Figure 1:
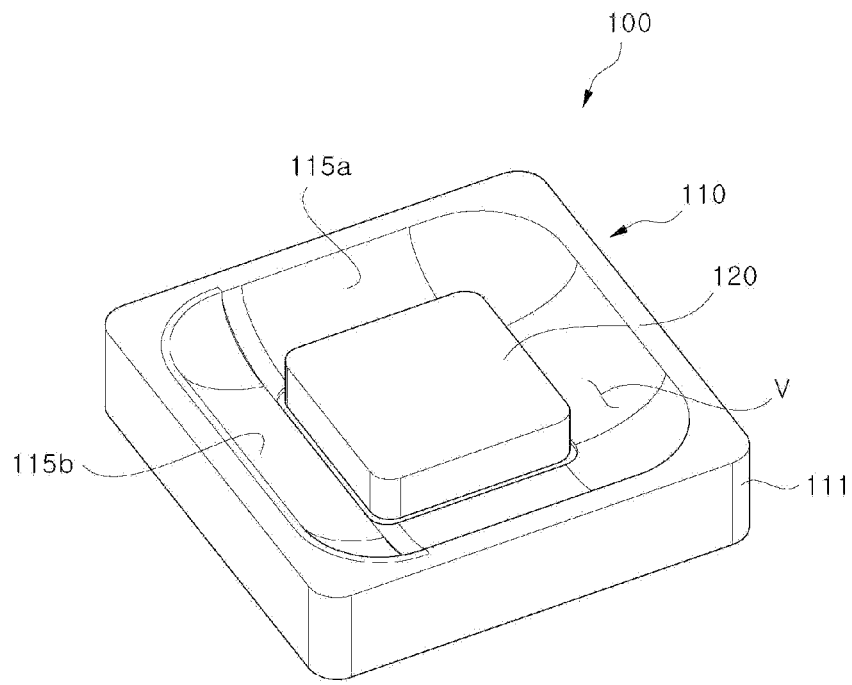
FIG. 1 is a perspective view of a light emitting diode package according to a first embodiment of the present disclosure.
Figure 2:
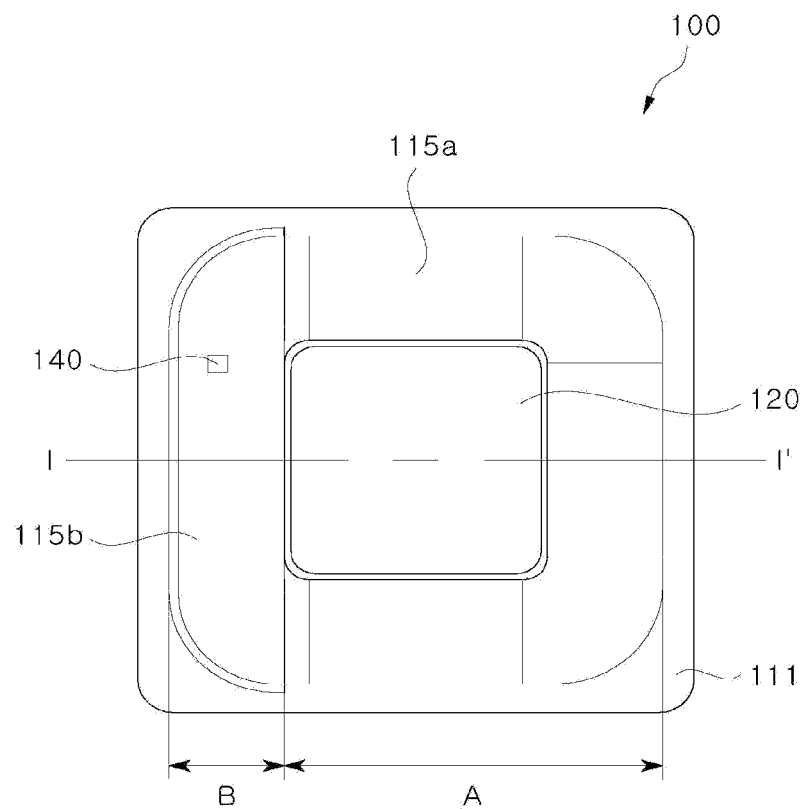
FIG. 2 is a plan view of the light emitting diode package of FIG. 1

FIG. 1 is a perspective view of a light emitting diode package according to a first embodiment of the present disclosure. FIG. 2 is a plan view of the light emitting diode package according to the first embodiment of the present disclosure and FIG. 3 is a cross-sectional view taken along line I-I' of FIG. 2.

Figure 3:
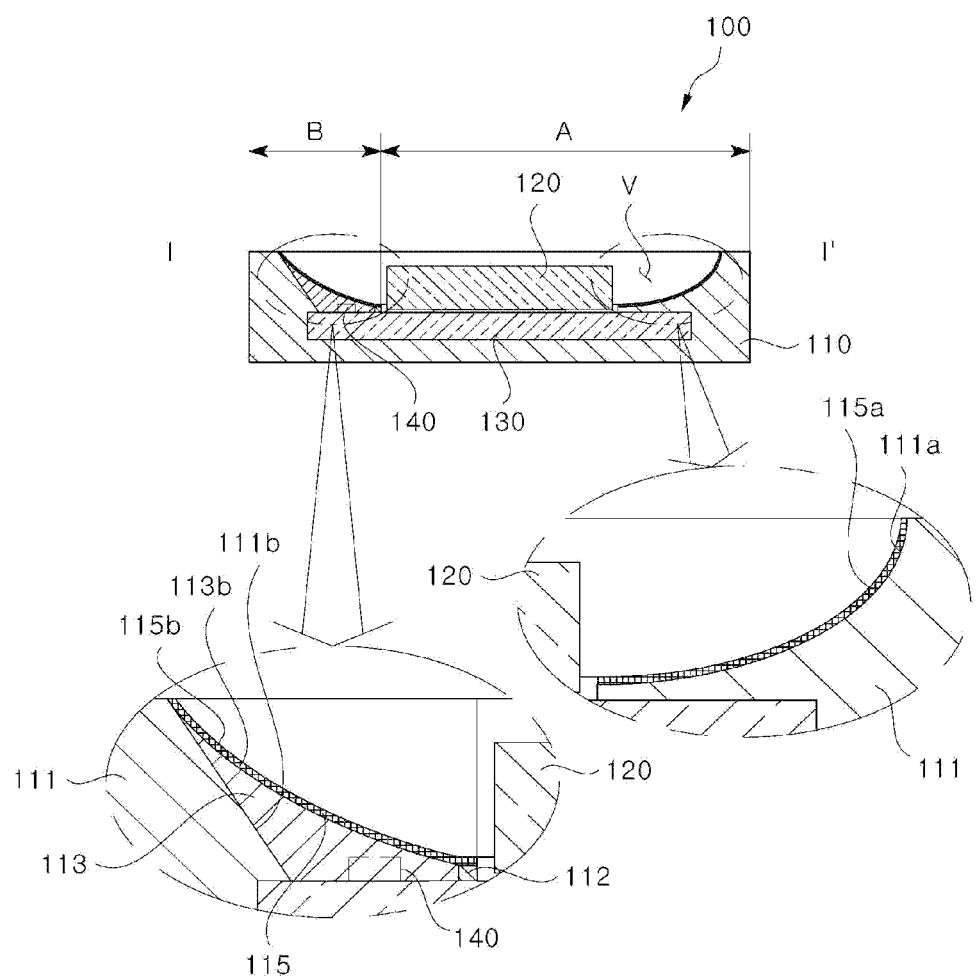
FIG. 3 is a cross-sectional view taken along line I-I' of FIG. 2.

Referring to FIG. 1 to FIG. 3, a light emitting diode package 100 according to a first embodiment includes a housing 110, a light emitting diode chip 120, a lead frame 130, and a Zener diode 140.

In this embodiment, the housing 110 includes a body 111, a cover portion 113 (FIG. 3), and a coating layer 115.

As shown in the drawings, the body 111 may have a substantially rectangular shape in plan view and may be configured to surround the lead frame 130 while supporting the lead frame 130. The housing 110 may have a cavity V open at one side thereof and may receive the light emitting diode chip 120 in the cavity V. Here, the cavity V may have a greater depth than the height of the light emitting diode chip 120.

Referring to FIG. 2 and FIG. 3, the body 111 may be divided into Region A and Region B. Region A may be a region in which the light emitting diode chip 120 is mounted and Region B may be a region in which the Zener diode 140 is mounted.

In Region A of the body 111, beveled surfaces of the cavity V surrounding the light emitting diode chip 120 may have the same shape with reference to the light emitting diode chip 120. Specifically, a first body beveled surface 111a is formed in Region A and may be a curved surface having an inclination gradually increasing to become a steep slope in an upward direction, as shown in FIG. 3. The beveled surfaces according to the teachings of the present disclosure include sloping surfaces rather than squared surfaces or surfaces perpendicular to an upper surface of the body 111. In some forms, one or more of the beveled surfaces have a ramp shape, such as a linear cross-sectional shape. In other forms, one or more of the beveled surfaces have a U-shape, such as a curved cross-sectional shape. In other words, the beveled surfaces include U-shaped beveled surfaces.

The first body beveled surface 111a in Region A is formed on each of three surfaces of the cavity V corresponding to three sides of the light emitting diode chip 120. An inner side of the first body beveled surface 111a shown in FIG. 3 may be disposed near the light emitting diode chip 120. As a result, light emitted from the light emitting diode chip 120 is reflected by the first body beveled surface 111a to be emitted from the light emitting diode package 100 in the upward direction.

A second body beveled surface 111b is formed in Region B and may be a linear cross-sectional shape, as shown in FIG. 3. However, it should be understood that, when the first body beveled surface 111a is a curved surface, the second body beveled surface 111b is not limited to a linear cross-sectional shape and may have a curved cross-sectional shape.

As shown in FIG. 2, Region B may have a greater width than Region A in a longitudinal direction. As will be described below, this structure is designed to secure a space for installation of the cover portion 113 covering the second body beveled surface 111b.

Referring to FIG. 3, the cover portion 113 is disposed to cover the second body beveled surface 111b in Region B. The cover portion 0113 is formed to a thickness so as to cover the Zener diode 140 disposed in Region B without extending beyond a stepped portion 112. As shown in FIG. 3, the cover portion 113 may have a cover beveled surface 113b having a gentle inclination. The cover beveled surface 113b may be a curved surface and may be formed to have an inclination gradually decreasing to form a gentle slope in a downward direction thereof.

Although the cover portion 113 is illustrated as not extending beyond the stepped portion 112, it should be understood that other implementations are possible. Alternatively, a portion of the cover portion 113 may extend to a mounting location of the light emitting diode chip 120 beyond the stepped portion 112. That is, the cover portion 113 may be formed of a viscous substance containing a reflective material so as to cover the second body beveled surface 111b and the Zener diode 140. Here, the reflective material may include $TiO_2$, $Al_2O_3$, and the like.

With the structure having the cover portion 113 formed in Region B, the cover beveled surface 113b formed in the cavity V of the light emitting diode package 100 may be formed in a similar shape to the shape of the first body beveled surface 111a. With this structure, a reflective surface formed in the cavity V has substantially the same shape in all directions with reference to the light emitting diode chip 120.

The coating layer 115 is formed of a coating material containing a reflective material to cover the first body beveled surface 111a and the cover beveled surface 113b. Here, the reflective material may include $TiO_2$, $Al_2O_3$, and the like. That is, the coating layer 115 may be formed to cover all regions in the cavity V of the light emitting diode package 100 excluding the light emitting diode chip 120. To this end, the coating layer 115 may be formed on the first body beveled surface 111a and the cover beveled surface 113b by various methods, such as spraying, dispensing, jetting, film attachment, sputtering, and e-beam deposition, which may be performed above the cavity V of the light emitting diode package 100, with an upper portion of the light emitting diode chip 120 masked.

As a result, in the light emitting diode package 100, a first coating beveled surface 115a may be formed in Region A of the cavity V and a second coating beveled surface 115b may be formed in Region B of the cavity V, as shown in FIG. 3.

Figure 4:
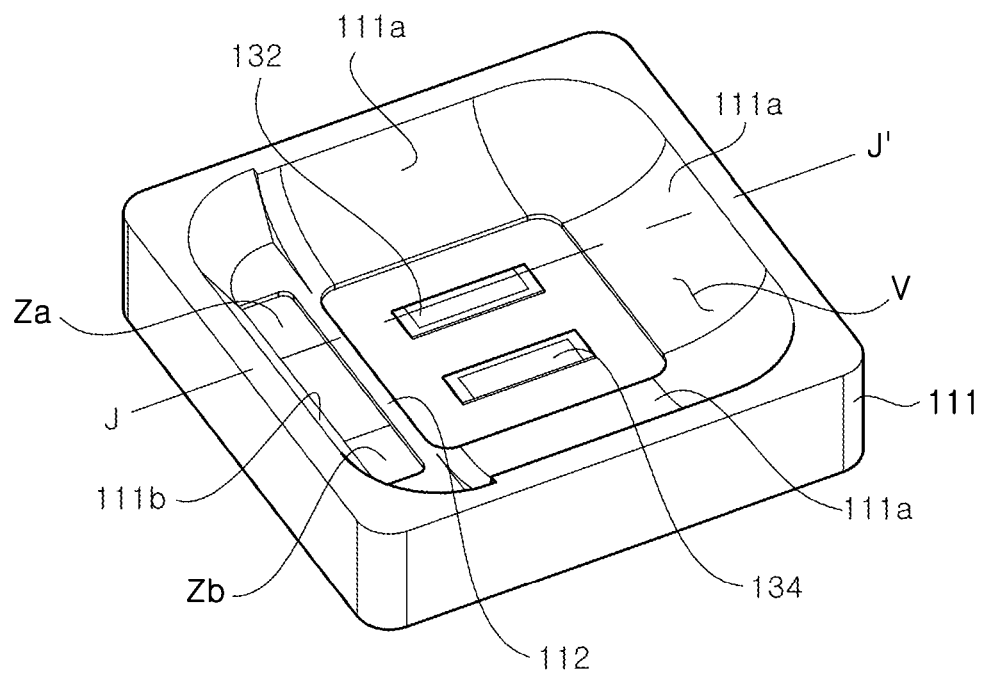
FIG. 4 is a perspective view of a body of the light emitting diode package of FIG. 1.
Figure 5:
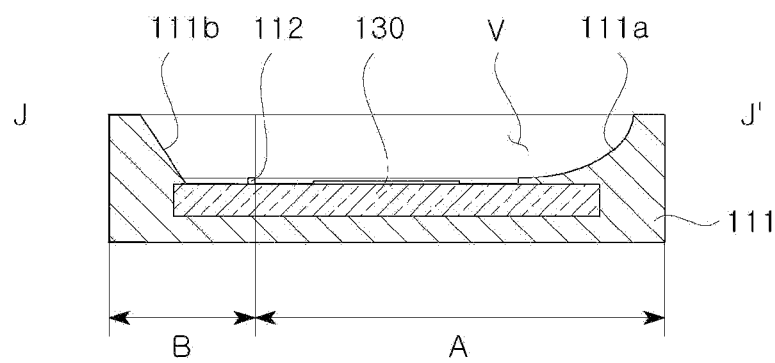
FIG. 5 is a cross-sectional view taken along line J-J' of FIG. 4.

FIG. 4 is a perspective view of the body of the light emitting diode package according to the first embodiment of the present disclosure and FIG. 5 is a cross-sectional view taken along line J-J' of FIG. 4.

Referring to FIG. 4, the body 111 of the light emitting diode package 100 according to this embodiment will be described in detail.

As shown in FIGS. 4-5, the body 111 is formed at the center thereof with the cavity V to receive the light emitting diode chip 120 and the Zener diode 140 therein. The cavity V is open at an upper side thereof. The cavity V may have a substantially rectangular shape in plan view. The cavity V has the first body beveled surface 111a and the second body beveled surface 111b formed on side surfaces thereof to reflect light emitted from the light emitting diode chip 120.

The first body beveled surface 111a is formed in Region A so as to surround the light emitting diode chip 120 at three sides of the cavity V having a rectangular shape. The first body beveled surface 111a may have an inclination gradually increasing in the upward direction thereof.

The second body beveled surface 111b is formed in Region B at one side of the light emitting diode chip 120 in the cavity V having a rectangular shape. The second body beveled surface 111b may have the same inclination.

The light emitting diode chip 120 is mounted in a central region of the cavity V, in which a first lead 132 and a second lead 134 may be partially exposed to the bottom of the cavity V. Here, the first lead 132 and the second lead 134 may be partially exposed to the mounting region of the light emitting diode chip 120 in the upward direction. Electrode pads of the light emitting diode chip 120 may electrically contact the first lead 132 and the second lead 134 exposed to protrude in the upward direction, respectively.

Here, the mounting region of the light emitting diode chip 120 may be depressed below inner distal ends of the first body beveled surface 111a and the second body beveled surface 111b, as shown in the drawings.

Although one light emitting diode chip 120 may be disposed at the center of the cavity V in this embodiment, it should be understood that multiple light emitting diode chips 120 may be disposed in the cavity.

The cavity V may be formed at one side thereof, that is, in Region B, with a Zener diode mounting portion Za on which the Zener diode 140 is mounted, and a wire bonding portion Zb for electrical connection of the Zener diode 140 through a wire.

The Zener diode mounting portion Za may be disposed where the first lead 132 is partially exposed to the bottom surface of the cavity V, and the wire bonding portion Zb may be disposed where the second lead 134 is partially exposed to the bottom surface of the cavity V. The Zener diode mounting portion Za and the wire bonding portion Zb may be electrically insulated from each other by the body 111.

In this embodiment, the Zener diode mounting portion Za is disposed on the first lead 132 and the wire bonding portion Zb is disposed on the second lead 134. Alternatively, the Zener diode mounting portion Za may be disposed on the second lead 134 and the wire bonding portion Zb may be disposed on the first lead 132.

The stepped portion 112 may be disposed between Region A and Region B. The stepped portion 112 may protrude above the surrounding region to divide the mounting region of the light emitting diode chip 120 from a mounting region of the Zener diode 140. Further, the stepped portion 112 may be formed to cross the bottom of the cavity V and the lead frame 130 may be exposed at both sides of the stepped portion 112, as shown in FIG. 5.

Figure 6:
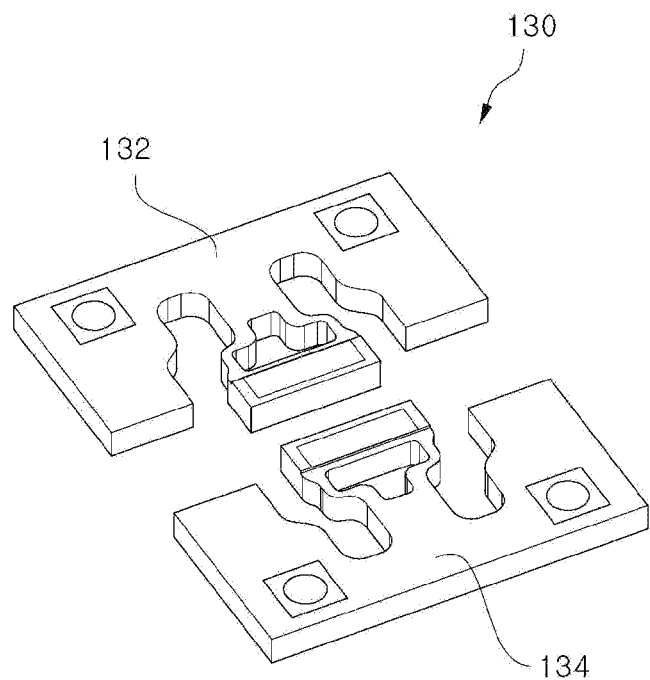
FIG. 6 illustrates a lead frame of the light emitting diode package of FIG. 1.

FIG. 6 is a perspective view of the lead frame of the light emitting diode package according to the first embodiment of the present disclosure.

Referring to FIG. 6, according to this embodiment, the lead frame 130 includes the first lead 132 and the second lead 134. The first lead 132 may be electrically connected to one of the electrode pads of the light emitting diode chip 120 and the Zener diode 140 may be mounted on the first lead 132. The second lead 134 may be electrically connected to the other electrode pad of the light emitting diode chip 120 and may be electrically connected to the Zener diode 140 through a wire.

In this embodiment, the lead frame 130 may be formed in a shape shown in FIG. 6 and may be disposed inside the body 111 excluding the mounting region of the light emitting diode chip 120 and a location to which the Zener diode 140 is electrically connected. Further, the first lead 132 and the second lead 134 may be partially exposed from the body 111 so as to be electrically connected to the outside.

Further, in this embodiment, the first lead 132 and the second lead 134 may be at least partially exposed to a lower surface of the body 111. With the structure having the first lead 132 and the second lead 134 exposed to the lower surface of the body 111, the light emitting diode package allows heat generated from the light emitting diode chip 120 to be discharged through the first lead 132 and the second lead 134.

Figure 7:
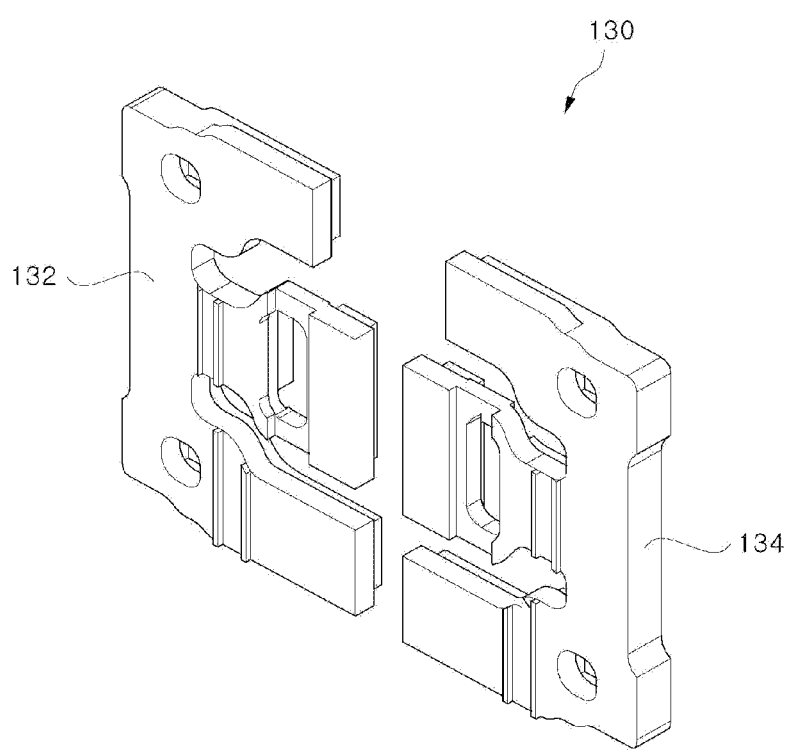
FIG. 7 is a view of a modification of the lead frame as shown in FIG. 6.
Figure 8:
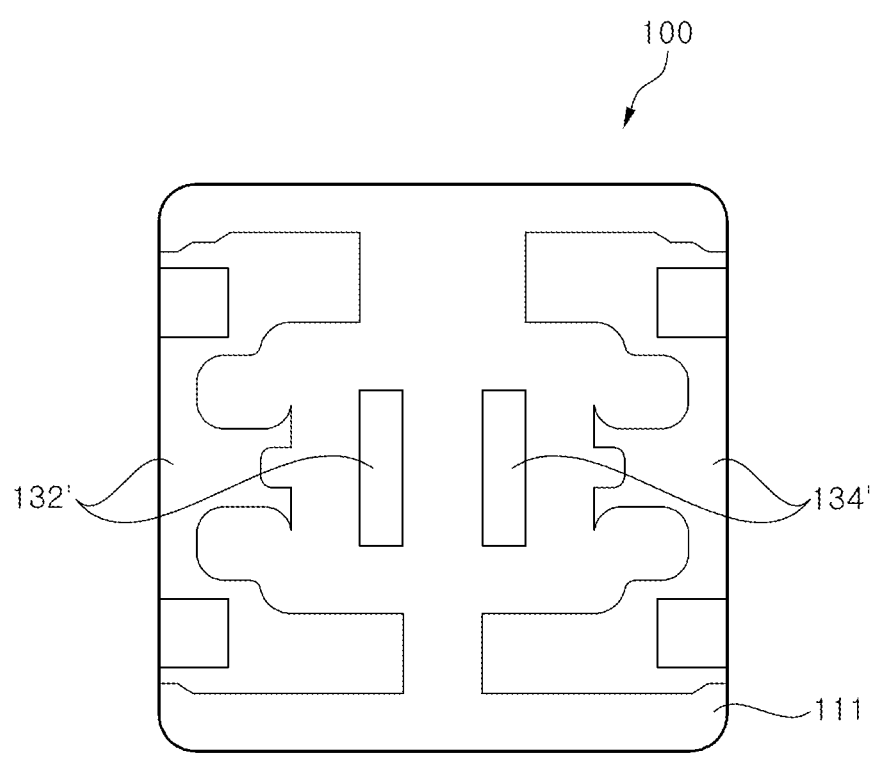
FIG. 8 is a view of a modification of the light emitting diode package to which the modification of the lead frame as shown in FIG. 7 is applied, illustrating the lead frame exposed to a lower surface of the light emitting diode package.

FIG. 7 illustrates a modification of the lead frame of the light emitting diode package according to the first embodiment of the present disclosure and FIG. 8 illustrates a modification of the light emitting diode package according to the first embodiment of the present disclosure to which the modification of the lead frame as shown in FIG. 7 is applied. FIG. 8 illustrates the lead frame exposed to the lower surface of the light emitting diode package.

Referring to FIG. 7, in this embodiment, the lead frame 130 may be formed in a shape shown in FIG. 7. In the modification, the lead frame 130 includes a first lead 132' and a second lead 134'. The first lead 132' may be electrically connected to one of the electrode pads of the light emitting diode chip 120 and the Zener diode 140 may be mounted on the first lead 132'. The second lead 134' may be electrically connected to the other electrode pad of the light emitting diode chip 120 and may be electrically connected to the Zener diode 140 through the wire.

The lead frame 130 may be disposed inside the body 111 excluding the mounting regions of the light emitting diode and the Zener diode 140 and a portion thereof electrically connected to the Zener diode 140.

Referring to FIG. 8, in this embodiment, the first lead 132 and the second lead 134 may be at least partially exposed to the lower surface of the body 111. Accordingly, in the structure where the first lead 132 and the second lead 134 are exposed to the lower surface of the body 111, the light emitting diode package allows heat generated from the light emitting diode chip 120 to be discharged from the lower surface of the body 111 through the first lead 132 and the second lead 134. As heat generated from the light emitting diode chip 120 can be discharged through the first lead 132 and the second lead 134, the light emitting diode package allows more efficient heat dissipation from the light emitting diode chip 120.

Figure 9:
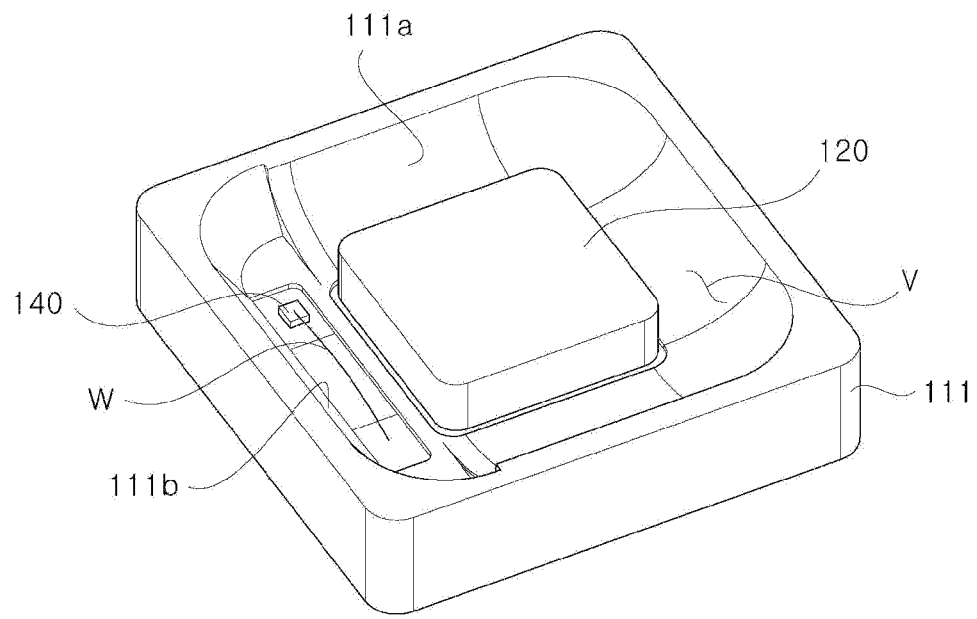
FIG. 9 is a perspective view of the light emitting diode package as shown in FIG. 1, illustrating a light emitting diode chip and a Zener diode mounted on the body of the light emitting diode package.

FIG. 9 is a perspective view of the light emitting diode package according to the first embodiment of the present disclosure, illustrating the light emitting diode chip 120 and the Zener diode 140 mounted on the body of the light emitting diode package.

Referring to FIG. 9, the light emitting diode chip 120 and the Zener diode 140 are mounted on the body 111. When the body 111 is formed to support the lead frame 130, the light emitting diode chip 120 is mounted thereon to be electrically connected to the first lead 132 and the second lead 134 exposed to the bottom of the cavity V. Then, the Zener diode 140 may be mounted on the Zener diode mounting portion Za and electrically connected to the wire bonding portion Zb through a wire.

Figure 10:
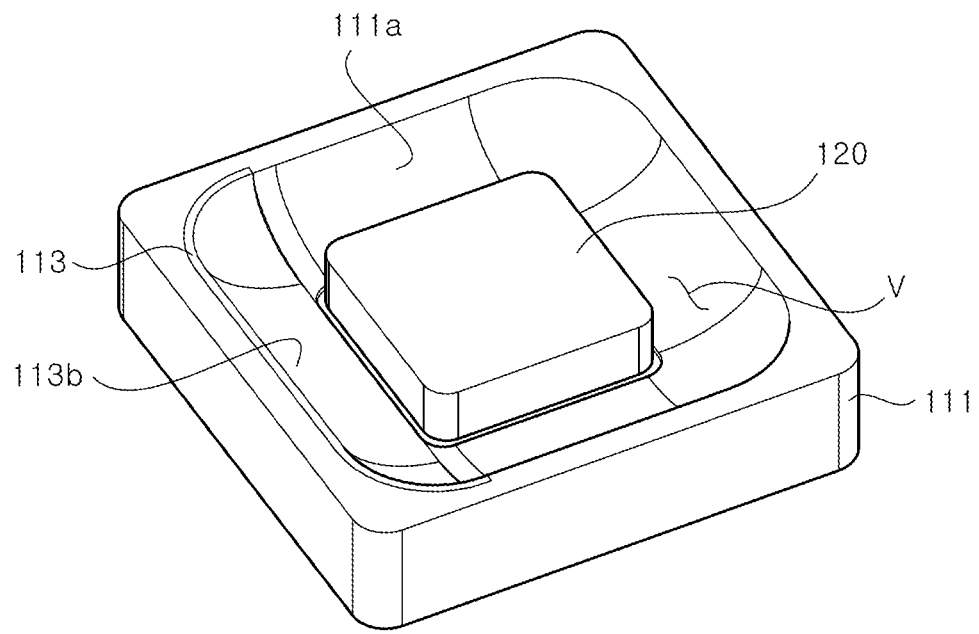
FIG. 10 is a perspective view of the light emitting diode package as shown in FIG. 1, illustrating a cover portion formed on the body of the light emitting diode package.

FIG. 10 is a perspective view of the light emitting diode package according to the first embodiment of the present disclosure, illustrating the cover portion 113 formed on the body of the light emitting diode package.

Referring to FIG. 10, the cover portion 113 is formed in Region B, in which the Zener diode 140 is mounted, so as to cover the Zener diode 140 and the wire. The cover portion 113 also covers the second body beveled surface 111$b$ to form the cover beveled surface 113$b$.

Specifically, the cover portion 113 also covers the second body beveled surface 111$b$ having a linear cross-sectional shape, thereby forming a beveled surface having a curvature, like the first body beveled surface 111$a$. In addition, as shown in FIG. 10, the cover portion 113 may fill a portion of Region A, in which the cavity V has a greater width than a portion of the cavity V in Region B, so as to minimize a boundary between Region A and Region B.

Accordingly, the first body beveled surface 111$a$ and the cover beveled surface 113$b$ corresponding to an inner wall of the cavity V, which surrounds the light emitting diode chip 120, may be formed substantially in the same shape.

With the cover portion 113 disposed on the body 111, the coating layer 115 is formed on the cavity V, thereby completing the light emitting diode package 100, as shown in FIG. 1 to FIG. 3.

Figure 11:
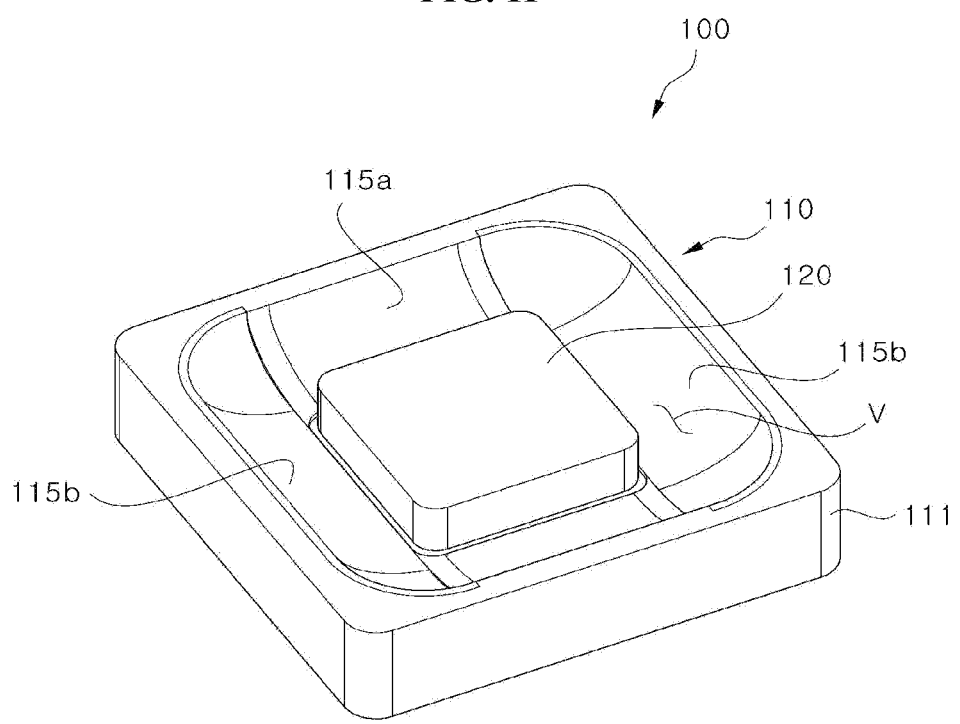
FIG. 11 is a perspective view of a light emitting diode package according to a second embodiment of the present disclosure.
Figure 12:
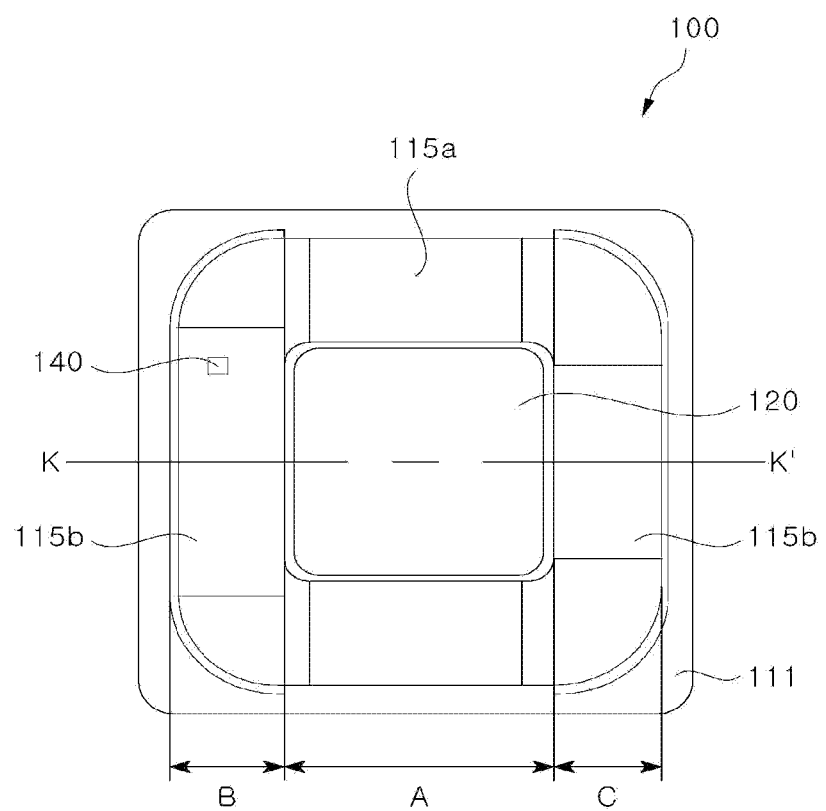
FIG. 12 is a plan view of the light emitting diode package as shown in FIG. 11.
Figure 13:
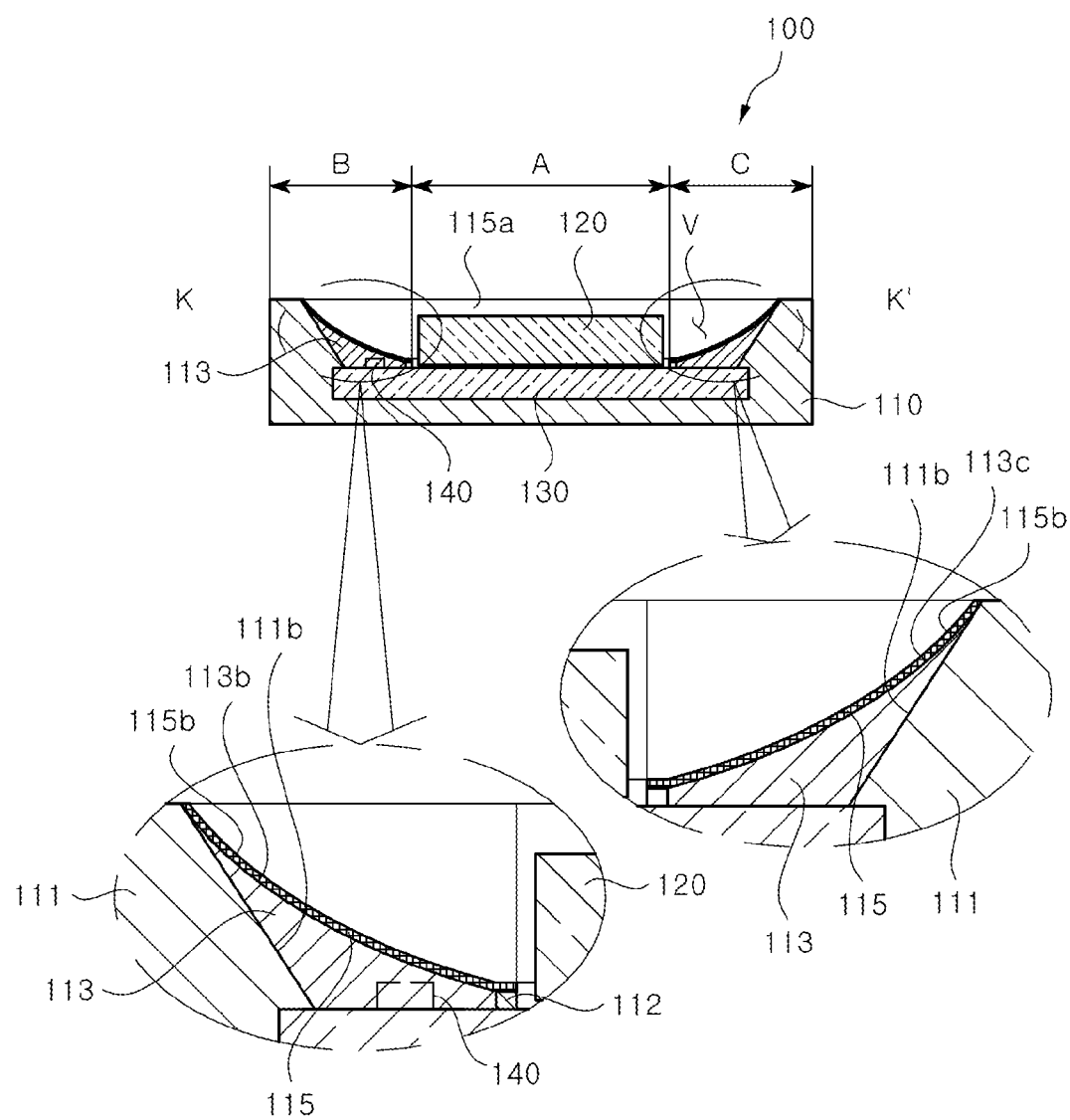
FIG. 13 is a cross-sectional view taken along line K-K' of FIG. 12.

FIG. 11 is a perspective view of a light emitting diode package according to a second embodiment of the present disclosure and FIG. 12 is a plan view of the light emitting diode package according to the second embodiment of the present disclosure. FIG. 13 is a cross-sectional view taken along line K-K' of FIG. 12.

Referring to FIG. 11 to FIG. 13, a light emitting diode package 100 according to the second embodiment includes a housing 110, a light emitting diode chip 120, a lead frame 130, and a Zener diode 140. Detailed description of the same components as those of the first embodiment will be omitted. The same components are described with the same reference numerals for convenience of descriptions, although there may be differences in different embodiments.

According to this embodiment, the housing 110 includes a body 111, a cover portion 113, and a coating layer 115.

The body 111 may be divided into Region A, Region B, and Region C. In this embodiment, Region A and Region B have the same shapes as those of the first embodiment, and Region C may have a second body beveled surface 111b as in Region B. The second body beveled surface 111b formed in Region C may have a linear cross-sectional shape. Further, Region C may have a greater width than Region A in the longitudinal direction.

The cover portion 113 may be disposed to cover the second body beveled surface 111b in Region C. The cover portion 113 formed in Region C may have the same shape as the cover portion 113 formed in Region B. However, Region C is not provided with the Zener diode 140, unlike Region B. Further, the cover portion 113 may have a cover beveled surface 113b having a gentle inclination. The cover beveled surface 113b formed in Region C may have the same inclination as the cover beveled surface 113b formed in Region B, so as to have a linearly symmetrical shape. Further, the cover portion 113 may be formed of a viscous substance containing a reflective material.

In this embodiment, the coating layer 115 is formed of a coating material containing a reflective material to cover the first body beveled surface 111a, the cover beveled surface 113b of Region B and the cover beveled surface 113c of Region C. The coating layer 115 may be formed of the same material and in the same manner as the coating layer of the first embodiment.

Accordingly, a first coating beveled surface 115a may be formed in Region A and a second coating beveled surface 115b may be formed in Region B and Region C. As shown in FIGS. 11-13, the first coating beveled surface 115a and the second coating beveled surface 115b may have the same shape despite difference in inclination therebetween.

According to this embodiment, as Region C has the same shape as Region B, Region B becomes symmetrical to Region C to allow uniform light emission when light emitted from the light emitting diode chip 120 is reflected and emitted from the light emitting diode package 100.

Figure 14:
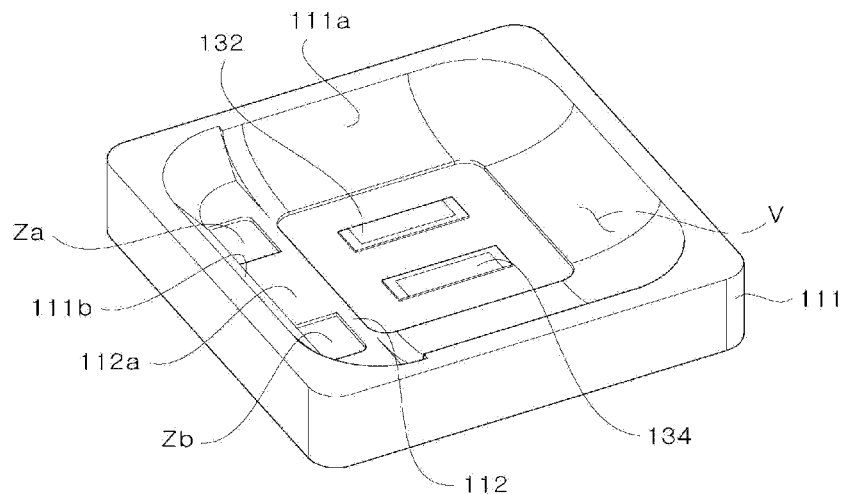
FIG. 14 is a perspective view of a body of a light emitting diode package according to a third embodiment of the present disclosure.

FIG. 14 is a perspective view of a body of a light emitting diode package according to a third embodiment of the present disclosure.

Referring to FIG. 14, detailed description of the same components of the light emitting diode package according to the third embodiment as those of the first embodiment will be omitted and the following description will focus on different features of the body 111 according to the third embodiment.

In this embodiment, the body 111 has a region for mounting the light emitting diode chip 120 at an inner center of the cavity on the bottom thereof, and a first lead 132 and a second lead 134 may be exposed to the mounting region of the light emitting diode chip 120, as shown in FIG. 14.

Further, a stepped portion 112 is disposed at one side of the region in which the light emitting diode chip 120 is mounted, and a Zener diode mounting portion Za and a wire bonding portion Zb are disposed at one side of the stepped portion 112. Here, a division step 112a is disposed between the Zener diode mounting portion Za and the wire bonding portion Zb.

As shown in FIG. 14, the division step 112a may be disposed between the Zener diode mounting portion Za and the wire bonding portion Zb, and may be a portion of the body 111. Further, the division step 112a may have the same height as the stepped portion 112. By the division step 112a, the Zener diode mounting portion Za and the wire bonding portion Zb may have a depressed shape with respect to surrounding regions.

In this embodiment, the division step 112a may have a vertically protruding shape protruding in an upward direction of the Zener diode mounting portion Za and the wire bonding portion Zb.

Figure 15:
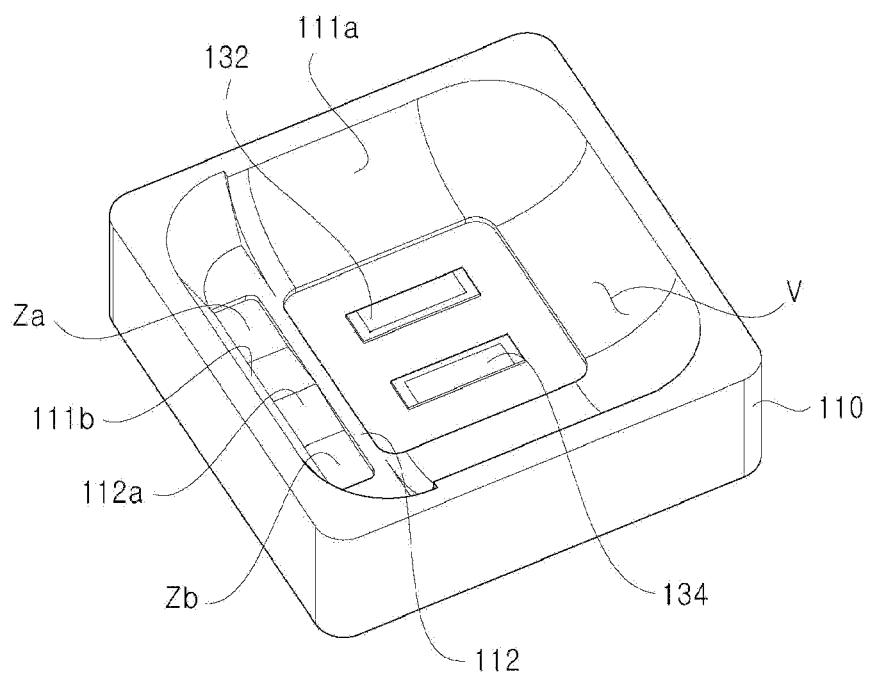
FIG. 15 is a perspective view of a body of a light emitting diode package according to a fourth embodiment of the present disclosure.

FIG. 15 is a perspective view of a body of a light emitting diode package according to a fourth embodiment of the present disclosure.

Referring to FIG. 15, detailed description of the same components of the light emitting diode package according to the fourth embodiment as those of the first embodiment will be omitted and the following description will focus on different features of the body 111 according to the fourth embodiment.

In this embodiment, the body 111 has a region for mounting the light emitting diode chip 120 at an inner center of the cavity on the bottom thereof, and a first lead 132 and a second lead 134 may be exposed to the mounting region of the light emitting diode chip 120, as shown in FIG. 15.

Further, a stepped portion 112 is disposed at one side of the region in which the light emitting diode chip 120 is mounted, and a Zener diode mounting portion Za and a wire bonding portion Zb are disposed at one side of the stepped portion 112. Here, a division step 112a is disposed between the Zener diode mounting portion Za and the wire bonding portion Zb.

As shown in FIG. 15, the division step 112a may be disposed between the Zener diode mounting portion Za and the wire bonding portion Zb, and may be a portion of the body 111. Further, as shown in FIG. 15, the division step 112a may include a beveled surface beveled in a direction from the Zener diode mounting portion Za towards the wire bonding portion Zb and a beveled surface beveled in a direction from the wire bonding portion Zb towards the Zener diode mounting portion Za. That is, the division step 112a may have a triangular cross-sectional shape and may have the same height as the stepped portion 112.

As the division step 112a has the beveled surfaces, it is possible to minimize the length of a wire electrically connecting the Zener diode 140 on the Zener diode mounting portion Za to the wire bonding portion Zb.

FIG. 16 to FIG. 20 are views of a light emitting diode package according to a fifth embodiment of the present disclosure.

Figure 16:
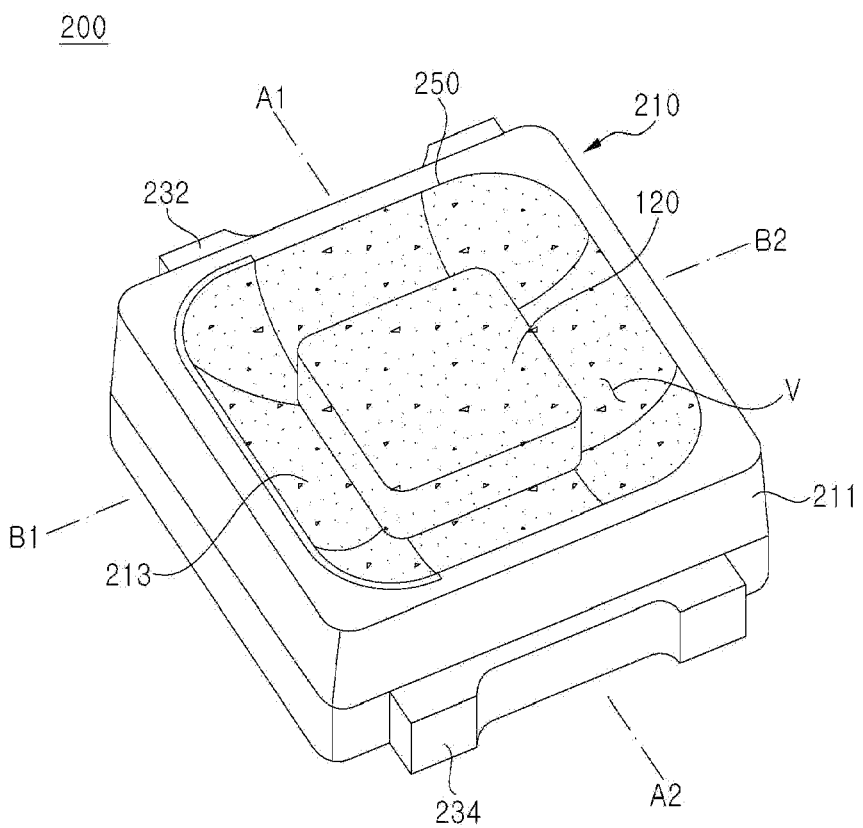
FIG. 16 is a perspective view of a light emitting diode package according to the fifth embodiment of the present disclosure.
Figure 17:
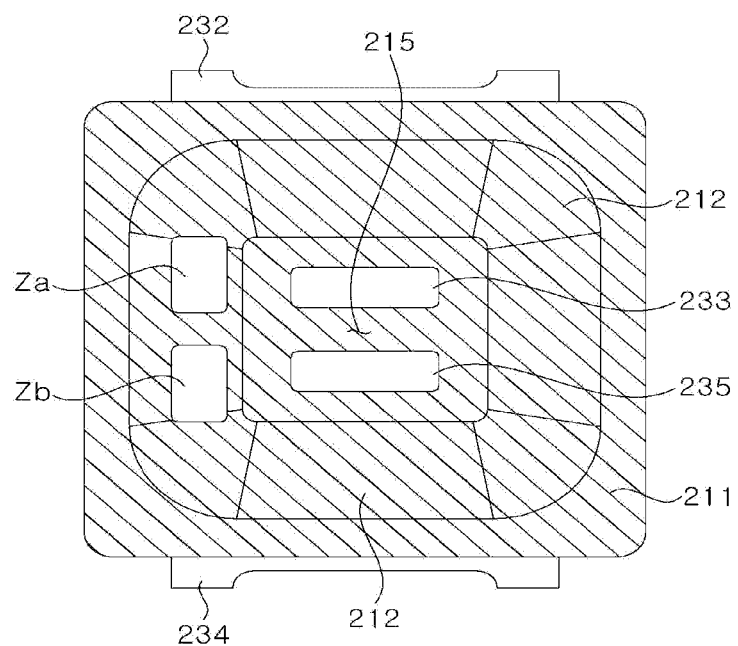
FIG. 17 is a top view of a lower portion of a body included in the light emitting diode package shown in FIG. 16.
Figure 18:
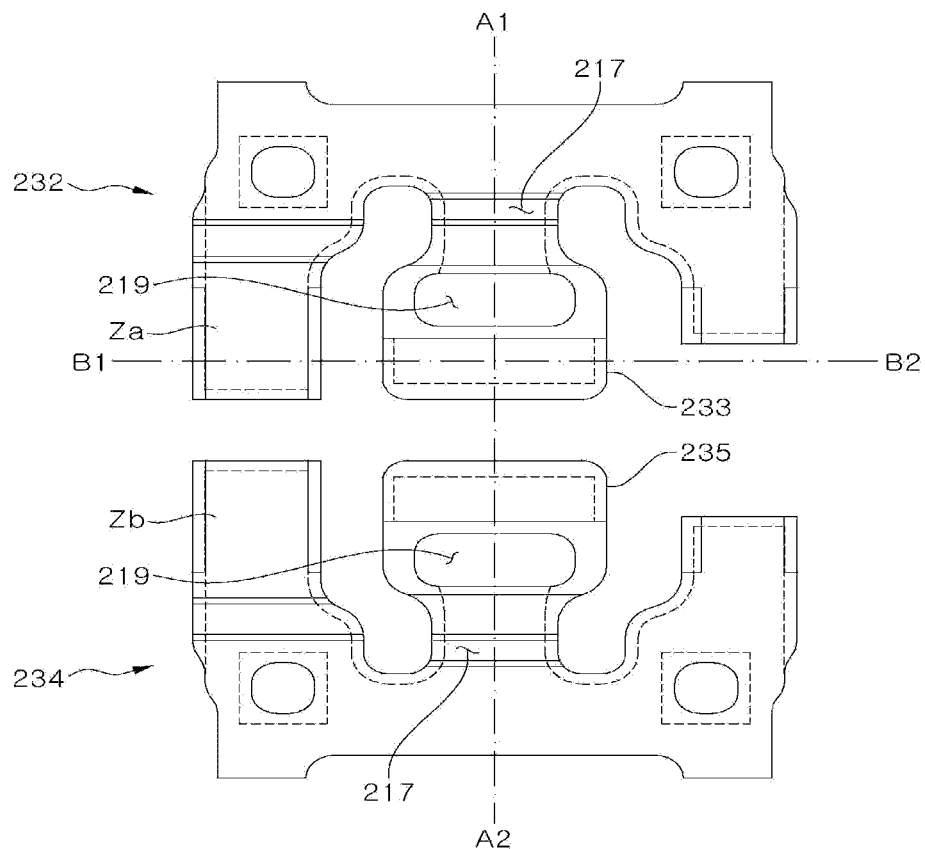
FIG. 18 is a plan view of a lead frame applied to the light emitting diode package according to the fifth embodiment.

FIG. 16 is a perspective view of the light emitting diode package 200 according to the fifth embodiment of the present disclosure. FIG. 17 is a top view of a lower portion of a body 211. FIG. 18 is a plan view of a lead frame 230 applied to the light emitting diode package 200 according to the fifth embodiment. In addition, FIG. 19 is a cross-sectional view taken along line A1-A2 of FIG. 16 and FIG. 20 is a cross-sectional view taken along line B1-B2 of FIG. 16.

The following description will focus on different features of the light emitting diode package 200 according to the fifth embodiment.

The light emitting diode package 200 according to the fifth embodiment includes a housing 210, a light emitting diode chip 120, a lead frame 230, a Zener diode 140, and a wavelength conversion member 250.

Figure 19:
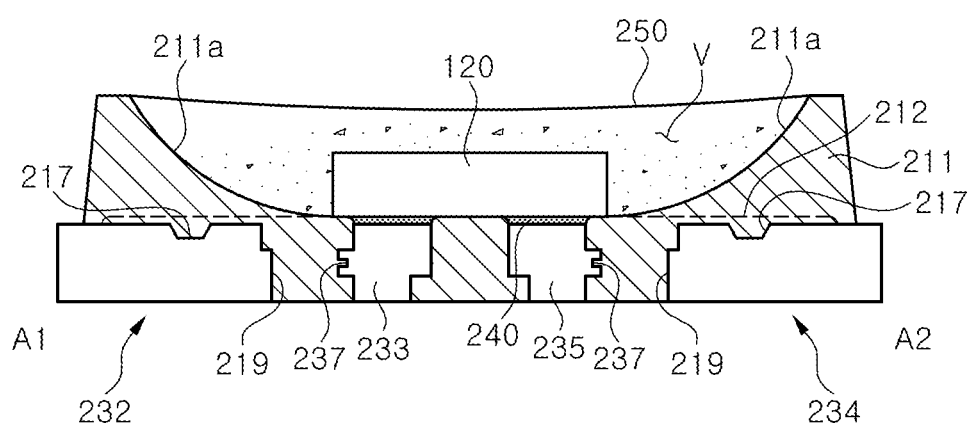
FIG. 19 is a cross-sectional view taken along line A1-A2 of FIG. 16.
Figure 20:
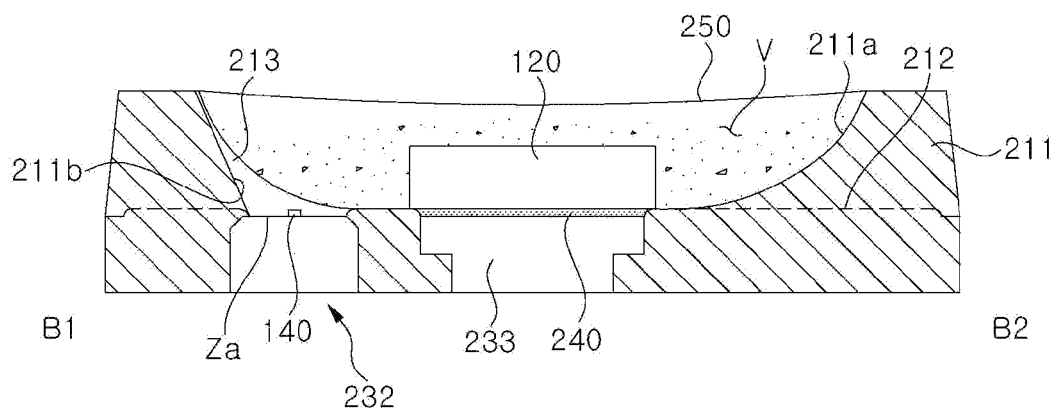
FIG. 20 is a cross-sectional view taken along line B1-B2 of FIG. 16

Referring to FIG. 19 and FIG. 20, a cavity V has a first body beveled surface 211a, one end of which is placed under the light emitting diode chip 120. Here, the one end of the first body beveled surface 211a corresponds to one end of a lower portion of the first body beveled surface 211a extending to the light emitting diode chip 120.

Further, the body 211 has a dam structure formed by a convex portion of a lower surface of the cavity V in the upward direction. A dam 212 is disposed between a cover portion 213, which covers a second body beveled surface 211b and the Zener diode 140, and the light emitting diode chip 120. Further, as shown in FIG. 20, a portion of the dam 212 is disposed under the light emitting diode chip 120. The dam 212 convexly protruding from the bottom of the cavity V may reflect light emitted from a lower side of the light emitting diode chip 120 in the upward direction.

The cover portion 213 covers the Zener diode 140 mounted on the Zener diode mounting portion Za. For example, the cover portion 213 is formed to cover the Zener diode 140 by filling a gap between the second body beveled surface 211b and the dam 212 with a viscous cover resin. Here, the dam 212 can prevent the cover resin from entering the region in which the light emitting diode chip 120 is mounted. Here, the viscous resin is a material forming the cover portion 213. For example, the cover resin may be a silicone resin containing a reflective material.

FIG. 17 is a plan view of the light emitting diode package 200 before an upper portion of the body 211 is not formed. That is, FIG. 17 shows an upper surface of a lower portion of the body 211. Here, the upper portion of the body 211 constitutes the cavity V and surrounds the light emitting diode chip 120 and the Zener diode 140.

The body 211 fills a gap between a first lead 232 and a second lead 234 to form the dam 212. As shown in FIG. 17, the dam 212 is formed along the circumference of a mounting region 215 in which the light emitting diode chip 120 is mounted. With this structure, the dam 212 can prevent a body resin from entering the mounting region 215 in the course of forming the upper portion of the body 211. Here, the body resin may be a material for the body 211. For example, the body resin may be a silicone resin containing a reflective material.

For description of the structure of the dam 213, the body 211 is divided into the upper portion and the lower portion. However, it should be noted that, since the upper portion and the lower portion of the body 211 are formed of the same material, the body 211 becomes an integrated structure in the course of forming the body 211.

Further, referring to FIG. 16, the cover portion 213 has a structure covering the entirety of one surface of the body 211 constituting the cavity V. However, it should be understood that the cover portion 213 is not limited thereto. The cover portion 213 may have a structure covering 90% or more of the one surface of the body 211 so as to cover the Zener diode 140, the Zener diode mounting portion Za, and the wire bonding portion Zb.

A bonding member 240 is interposed between a lower surface of the light emitting diode chip 120 and the lead frame 230, as shown in FIG. 19. That is, the light emitting diode chip 120 is attached to the lead frame 230 by the bonding member 240. Further, the bonding member 240 includes an electrically conductive material and serves to electrically connect the light emitting diode chip 120 to the lead frame 230. For example, the bonding member 240 may be formed of solders.

The lead frame 230 includes the first lead 232 and the second lead 234.

The first lead 232 includes a first mounting portion 233 in which the light emitting diode chip 120 is mounted, and the second lead 234 includes a second mounting portion 235 in which the light emitting diode chip 120 is mounted.

A side surface of each of the first mounting portion 233 and the second mounting portion 235 has a stepped structure.

Referring to FIG. 19, one side surface of each of the first mounting portion 233 and the second mounting portion 235 has an upper portion protruding more than a lower portion thereof. Here, the one side surface of the first mounting portion 233 faces the one side surface of the second mounting portion 235, as shown in FIGS. 18 and 19.

Further, the other side surface of each of the first mounting portion 233 and the second mounting portion 235 has a central portion protruding more than upper and lower portions thereof, as shown in FIG. 19. Here, the other side surface of each of the first mounting portion 233 and the second mounting portion 235 is opposite to the one side surface thereof.

Further, a protruding portion of each of the first mounting portion 233 and the second mounting portion 235 is formed with a concave groove 237.

With this structure, the protruding portion is inserted into one surface of the body 211 adjoining the first mounting portion 233 and the second mounting portion 235. Further, the groove 237 of the protruding portion is filled with the body 211.

As such, the light emitting diode package 200 has the structure where the protruding portion of each of the first lead 232 and the second lead 234 is inserted into the body 211 and the body 211 is inserted into the grooves 237 formed on the protruding portions. That is, the light emitting diode package 200 has a double engagement structure where the first lead 232 and the second lead 234 engage with the body 211. With this structure of the light emitting diode package 200, the first lead 232 and the second lead 234 can be more firmly coupled to the body 211. Further, such a structure of the light emitting diode package 200 blocks a penetration path of foreign matter, thereby preventing damage to internal components of the light emitting diode package 200 due to penetration of foreign matter. Here, the foreign matter may include moisture, dust, and the like present outside the light emitting diode package 200.

Further, a side surface of the first lead 232 facing the other side surface of the first mounting portion 233 has a lower portion protruding more than an upper portion thereof. Further, a side surface of the second lead 234 facing the other side surface of the second mounting portion 235 has a lower portion protruding more than an upper portion thereof, as shown in FIG. 19.

Further, an upper surface of each of the first lead 232 and the second lead 234 may be formed with at least one groove 217, as shown in FIG. 19. The grooves 217 may be filled with the body 211.

Referring to FIG. 20, both side surfaces of the first mounting portion 233 of the first lead 232 have a structure where an upper portion thereof protrudes more than a lower portion thereof. FIG. 19 and FIG. 20 are cross-sectional views observed in opposite directions. That is, both side surfaces of the first mounting portion 233 shown in FIG. 19 are opposite to both side surfaces of the first mounting portion 233 shown in FIG. 20.

Further, although not shown in FIG. 20, the second mounting portion 235 of the second lead 234 may also have the same structure as the first mounting portion 233.

Referring to FIG. 19, the first lead 232 is formed with a through-hole 219 between the first mounting portion 233 and an outer side surface thereof. Further, the second lead 234 is formed with a through-hole 219 between the second mounting portion 235 and an outer surface thereof. Here, the outer surface refers to one surface exposed on a side surface of the body 211. The through-hole 219 may have various structures. In this embodiment, the through-hole 219 has an elliptical shape in light of strength (thickness) of the lead frame 230 around the through-hole 219, the area of the through-hole 219, and ease in formation of the through-hole 219.

A bonding area between the lead frame 230 and the body 211 is increased by the through-hole 219 and the multi-stepped structure of the first lead 232 and the second lead 234 described with reference to FIG. 18 to FIG. 20. Further, the multi-stepped structure of the first lead 232 and the second lead 234 increases a penetration path distance of foreign matter, thereby preventing damage to the light emitting diode package 200 due to penetration of foreign matter. As a result, the light emitting diode package 200 has improved reliability.

The wavelength conversion member 250 is formed in the cavity V of the body 211. The wavelength conversion member 250 includes a light transmitting resin and a wavelength conversion material dispersed in the light transmitting resin. For example, the light transmitting resin may be an epoxy resin or a silicone resin.

The wavelength conversion material converts the wavelength of light emitted from the light emitting diode chip 120. For example, the wavelength conversion material may be a phosphor.

In this embodiment, the wavelength conversion member 250 may be formed by mixing a red phosphor with a green phosphor in the light transmitting resin. For improvement in luminous intensity, the wavelength conversion member 250 may further include a blue phosphor. The light emitting diode package 200 may emit a mixture of light emitted from the light emitting diode chip 120 and light excited by each of the phosphors. The kinds of phosphors in the light transmitting resin may be selected in various ways depending on the color of light emitted from the light emitting diode package 200.

As shown in FIG. 19 and FIG. 20, a greater amount of the wavelength conversion material may be dispersed at a lower portion of the light transmitting resin than at an upper portion thereof. That is, the wavelength conversion material may be present at a higher concentration on the bottom of the cavity V and around the light emitting diode chip 120 than at the upper portion of the light transmitting resin. That is, the wavelength conversion member 250 may have a structure where the wavelength conversion material has an upwardly convex distribution at a central portion of the wavelength conversion member 250.

The wavelength conversion member 250 filling the cavity V may surround the light emitting diode chip 120 to protect the light emitting diode chip 120 from external materials and external impact.

Figure 21:
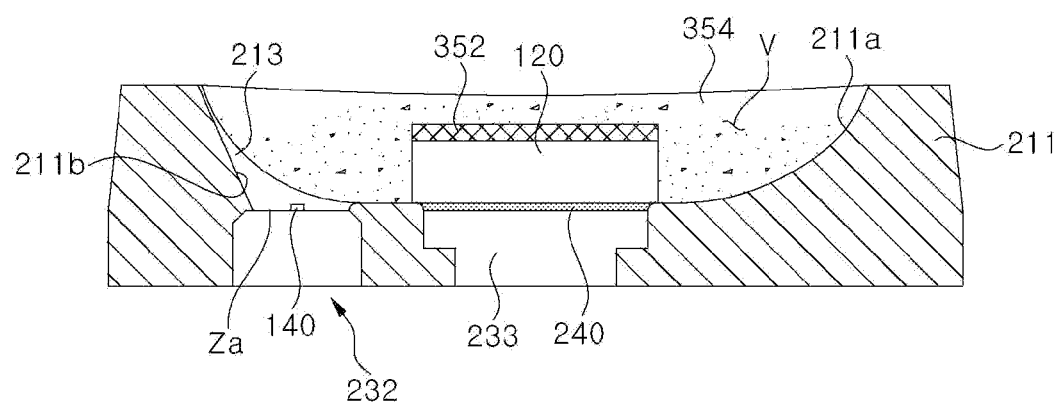
FIG. 21 illustrates a light emitting diode package according to a sixth embodiment of the present disclosure.

FIG. 21 is a sectional view of a light emitting diode package according to a sixth embodiment of the present disclosure.

The light emitting diode package 300 according to the sixth embodiment has the same structure as the light emitting diode package according to the above fifth embodiment excluding the wavelength conversion member. The following description will focus on different features of the light emitting diode package 300 according to the sixth embodiment.

Referring to FIG. 21, the light emitting diode package 300 includes a first wavelength conversion member 352 and a second wavelength conversion member 354.

The first wavelength conversion member 352 may be formed to cover an upper surface of the light emitting diode chip 120. For example, the first wavelength conversion member 352 may be formed by dispersing a first wavelength conversion material in a light transmitting film.

The second wavelength conversion member 354 may be formed to cover the light emitting diode chip 120 and the first wavelength conversion member 352 by filling the cavity V of the body 211. For example, the second wavelength conversion member 354 may be formed by dispersing a second wavelength conversion material in a light transmitting film. Here, as shown in FIG. 21, the second wavelength conversion material may have an upwardly convex distribution in the region where the light emitting diode chip 120 is disposed.

The first wavelength conversion material and the second wavelength conversion material convert light into light in different wavelength bands. For example, the first wavelength conversion material may be a red phosphor and the second wavelength conversion material may be a green phosphor.

Although FIG. 21 shows the first wavelength conversion member 352 covering only the upper surface of the light emitting diode chip 120 in this embodiment, it should be understood that the light emitting diode chip 120 may cover the upper and side surfaces of the light emitting diode chip 120.

Figure 22:
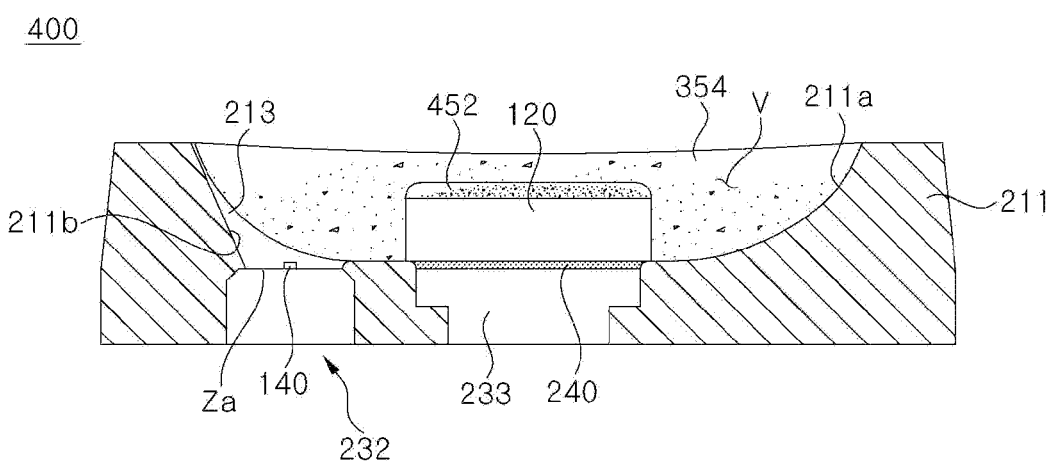
FIG. 22 illustrates a light emitting diode package according to an seventh embodiment of the present disclosure.

FIG. 22 is a sectional view of a light emitting diode package according to an seventh embodiment of the present disclosure.

The light emitting diode package 400 according to the seventh embodiment has the same structure as the light emitting diode package according to the sixth embodiment excluding the wavelength conversion member. Accordingly, the following description will focus on different features of the light emitting diode package 400 according to the seventh embodiment.

Referring to FIG. 22, the light emitting diode package 400 includes a first wavelength conversion member 452 and a second wavelength conversion member 354.

In this embodiment, the first wavelength conversion member 452 may be formed by depositing a wavelength conversion resin on the upper surface of the light emitting diode chip 120 through a dotting process. The wavelength conversion resin may be a light transmitting resin that contains a first wavelength conversion material dispersed therein.

When the wavelength conversion material is dotted at the center of the upper surface of the light emitting diode chip 120, the wavelength conversion material spreads along the upper surface of the light emitting diode chip 120. As a result, a greater amount of the wavelength conversion material may be dispersed at the center of the upper surface of the light emitting diode chip 120 than regions around the center thereof. Thus, as shown in FIG. 22, the first wavelength conversion member 452 has a structure where the first wavelength conversion material has an upwardly convex distribution at the center thereof.

Although some exemplary embodiments have been described herein with reference to the accompanying drawings, it should be understood by those skilled in the art that these embodiments are given by way of example only, and that various modifications, variations, and alterations can be made without departing from the spirit and scope of the present disclosure. Therefore, the scope of the present disclosure should be interpreted according to the following appended claims and equivalents thereto.

What is claimed is:

1. A light emitting diode package comprising:
a body having a cavity open at an upper side thereof and comprising beveled surfaces constituting side surfaces of the cavity;
a first lead and a second lead supported by the body and separated from each other to be electrically insulated from each other;
a light emitting diode chip electrically connected to the first lead and the second lead and mounted in a first region of the cavity of the body, a boundary of the first region including a first, second, and third sides connected to the beveled surfaces, and an entire area of the first region being defined at a bottom of the cavity and exposed by the body; and
a Zener diode mounted at one side of the light emitting diode chip and disposed in a second region of the cavity of the body, the second region being defined at a bottom of the cavity and an entire area of the second region exposed by the body,
wherein the light emitting diode chip is surrounded by the beveled surfaces of the body;
wherein the beveled surfaces of the body include a first beveled surface having a first inclination and a second beveled surface having a second inclination different from the first inclination, the second beveled surface being placed adjacent to the Zener diode; and
wherein the first region and the second region of the cavity of the body are disposed along a first direction and a maximum width of the second region is greater than a maximum width of the first region, the width of the first region and the width of the second region being measured in a second direction perpendicular to the first direction,
wherein the first lead comprises a first mount on which the light emitting diode chip is mounted, one side surface of the first mount disposed along the second direction and having a stepped structure.

2. The light emitting diode package according to claim 1, further comprising:
a cover portion configured to cover the second beveled surface.

3. The light emitting diode package according to claim 2, wherein the cover portion is disposed to cover the Zener diode.

4. The light emitting diode package according to claim 2, wherein the cover portion comprises the second beveled surface having an inclination gradually increasing in an upward direction thereof.

5. The light emitting diode package according to claim 4, wherein the cover portion includes a substance containing a reflective material.

6. The light emitting diode package according to claim 2, further comprising:
a coating layer covering the cover portion and the first beveled surface of the body.

7. The light emitting diode package according to claim 6, wherein the coating layer includes a substance containing a reflective material.

8. The light emitting diode package according to claim 7, wherein the reflective material comprises at least one selected from among $TiO_2$ and $Al_2O_3$.

9. The light emitting diode package according to claim 1, wherein the body comprises a stepped portion dividing a mounting region of the light emitting diode chip from a mounting region of the Zener diode,
the stepped portion protruding upwards above the mounting region of the light emitting diode chip relative to a bottom surface of the cavity.

10. The light emitting diode package according to claim 9, further comprising:
a cover portion covering the second beveled surface,
the cover portion being formed to a height of the stepped portion.

11. The light emitting diode package according to claim 1, wherein the Zener diode is mounted on the first lead and electrically connected to the first lead, the Zener diode electrically connected to the second lead through a wire.

12. The light emitting diode package according to claim 1, wherein the first lead and the second lead exposed to a mounting region of the light emitting diode chip, the first lead and the second lead partially protruding in an upward direction.

13. The light emitting diode package according to claim 1, wherein the first beveled surface and the second beveled surface are disposed at opposite sides.

14. The light emitting diode package according to claim 1, wherein the first beveled surface, the second beveled surface, or both have a lower portion extending to the light emitting diode chip to be disposed at one end thereof.

15. The light emitting diode package according to claim 1, wherein the body further comprises a bottom of the cavity surrounding a mounting region of the light emitting diode chip and forming an upwardly protruding dam structure, at least a portion of the dam structure being disposed under the light emitting diode chip.

16. The light emitting diode package according to claim 1, wherein
the second lead comprises a second mount on which the light emitting diode chip is mounted; and
one side surface of the second mount has a stepped structure.

17. The light emitting diode package according to claim 1, further comprising:
a wavelength conversion member filling the cavity of the body to cover the light emitting diode chip.

18. The light emitting diode package according to claim 1, further comprising:
a first wavelength conversion member covering at least an upper surface of the light emitting diode chip; and
a second wavelength conversion member filling the cavity of the body to cover the light emitting diode chip and the first wavelength conversion member,
wherein the first wavelength conversion member and the second wavelength conversion member convert light into light in different wavelength bands.

* * * * *